United States Patent
Lee et al.

(10) Patent No.: US 10,084,449 B2
(45) Date of Patent: Sep. 25, 2018

(54) SEMICONDUCTOR STRUCTURE AND OPERATION METHOD OF THE SAME

(71) Applicant: MACRONIX INTERNATIONAL CO., LTD., Hsinchu (TW)

(72) Inventors: Ming-Yin Lee, Hsinchu (TW); Wen-Tsung Huang, Changhua County (TW); Shih-Yu Wang, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/371,285

(22) Filed: Dec. 7, 2016

(65) Prior Publication Data
US 2018/0159531 A1    Jun. 7, 2018

(51) Int. Cl.
| | |
|---|---|
| H01L 27/02 | (2006.01) |
| H03K 17/687 | (2006.01) |
| H01L 27/092 | (2006.01) |
| H01L 27/06 | (2006.01) |

(52) U.S. Cl.
CPC ..... *H03K 17/6872* (2013.01); *H01L 27/0266* (2013.01); *H01L 27/0629* (2013.01); *H01L 27/0928* (2013.01)

(58) Field of Classification Search
CPC ............ H01L 27/0266; H01L 27/0629; H01L 27/0928; H03K 17/6872
USPC .......................... 327/419, 427, 428, 574, 582
See application file for complete search history.

(56) References Cited

U.S. PATENT DOCUMENTS

| | | | |
|---|---|---|---|
| 6,236,087 B1 | 5/2001 | Daly et al. | |
| 9,882,375 B2 * | 1/2018 | Van Wijmeersch | ... H02H 9/046 |
| 2003/0234405 A1 * | 12/2003 | Lai | ...... H01L 27/0262 257/107 |
| 2004/0065895 A1 | 4/2004 | Lai et al. | |
| 2010/0109043 A1 * | 5/2010 | Wang | ................. H01L 27/0251 257/133 |
| 2010/0109076 A1 * | 5/2010 | Wang | ................. H01L 27/0251 257/328 |
| 2013/0169066 A1 | 7/2013 | Chen et al. | |
| 2013/0258534 A1 | 10/2013 | Shrivastava et al. | |
| 2013/0279053 A1 | 10/2013 | Ritter et al. | |
| 2013/0321963 A1 | 12/2013 | Lai et al. | |
| 2015/0194420 A1 * | 7/2015 | Wang | ................. H01L 27/0262 257/133 |

(Continued)

OTHER PUBLICATIONS

TIPO Office Action dated Feb. 10, 2017 in Taiwan application (No. 105140722).

*Primary Examiner* — William Hernandez
(74) *Attorney, Agent, or Firm* — McClure, Qualey & Rodack, LLP

(57) ABSTRACT

A semiconductor structure includes a first heavily doped region, a first well, a second well and a second heavily doped region disposed sequentially. The first well and the second heavily doped region have a first conductive type. The second well and the first heavily doped region have a second conductive type. The semiconductor structure further includes at least one switch, such that at least one of conditions (A) and (B) is satisfied. (A) The switch is coupled between the first well and the first node such that the first well is controlled by the switch and floated under an ESD protection mode. (B) The switch is coupled between the second well and the second node such that the second well is controlled by the switch and floated under an ESD protection mode.

19 Claims, 4 Drawing Sheets

(56) References Cited

U.S. PATENT DOCUMENTS

2016/0035834 A1    2/2016  Mohai et al.
2018/0096986 A1*   4/2018  Oh ..................... H01L 27/0266

* cited by examiner

SEMICONDUCTOR STRUCTURE AND OPERATION METHOD OF THE SAME

The disclosure relates to a semiconductor structure and an operation method of the same. More particularly, the disclosure relates to a semiconductor structure suitable for electrostatic discharge (ESD) protection application and an operation method of the same.

BACKGROUND

ESD may cause damage to sensitive electronic devices. As such, ESD protection is generally provided to the semiconductor structures. Semiconductor controlled rectifier (SCR) is a widely used ESD protection structure for the semiconductor structures such as I/O pads, high voltage pads or the like. However, a typical SCR has a trigger voltage that may be too high for the ESD protection application since an avalanche breakdown occurs at the N/P junction before the SCR is turned on. As such, the research and improvement of the ESD protection application have been conducted to this day.

SUMMARY

In this disclosure, a semiconductor structure, particular a semiconductor structure suitable for ESD protection application, and an operation method of the same are provided.

According to some embodiments, the semiconductor structure comprises a first well, a second well, a first heavily doped region, a second heavily doped region, and at least one switch. The first well has a first conductive type. The second well has a second conductive type different from the first conductive type. The second well is coupled to the first well. The first heavily doped region has the second conductive type. The first heavily doped region is coupled to the first well. The first heavily doped region is coupled to a first node. The second heavily doped region has the first conductive type. The second heavily doped region is coupled to the second ell. The second heavily doped region is coupled to a second node. The at least one switch is configured to satisfy at least one of following conditions (A) and (B):(A) the switch is coupled between the first well and the first node, such that the first well is controlled by the switch and floated under an electrostatic discharge (ESD) protection mode; and (B) the switch is coupled between the second well and the second node, such that the second well is controlled by the switch and floated under an electrostatic discharge (ESD) protection mode.

According to some embodiments, the operation method of the semiconductor structure as described above comprises at least one of following steps (a) and (b) corresponding to the conditions (A) and (B), respectively: (a) under the ESD protection mode, turning off the switch, so as to float the first well; and (b) under the ESD protection mode, turning off the switch, so as to float the second well.

Figure 1:
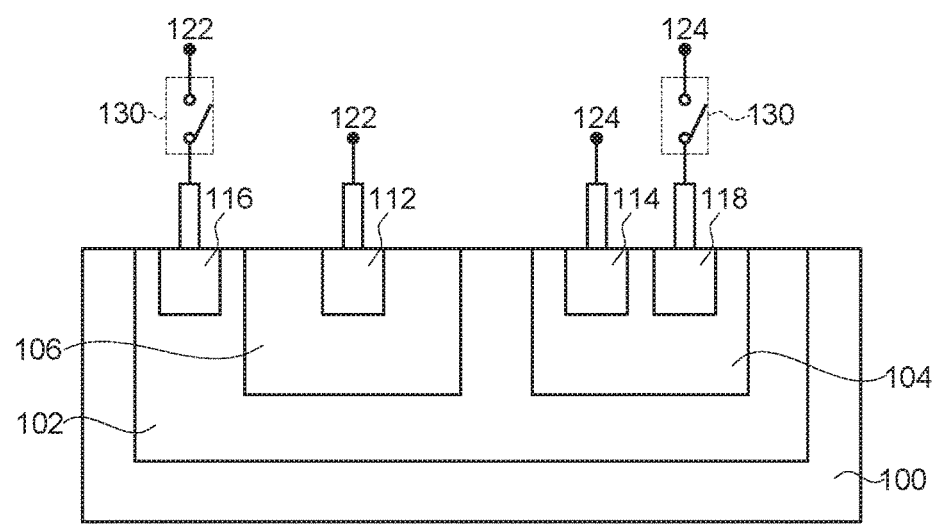
FIG. 1 shows a semiconductor structure according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A semiconductor structure according to embodiments comprises a first well, a second well, a first heavily doped region, a second heavily doped region, and at least one switch. The second well is coupled to the first well. The first heavily doped region is coupled to the first well. The first heavily doped region is coupled to a first node. The second heavily doped region is coupled to the second well. The second heavily doped region is coupled to a second node. The first well and the second heavily doped region have a first conductive type. The second well and the first heavily doped region have a second conductive type different from the first conductive type. According to some embodiments, the first node may be an anode, and the second node may be a cathode. According to some embodiments, the first conductive type may be n-type, and the second conductive type may be p-type. According to some embodiments, the first transistor may be a PMOS, and the second transistor may be a NMOS.

In the semiconductor structure according to embodiments, the at least one switch is configured to satisfy at least one of following conditions (A) and (B). (A) The switch is coupled between the first well and the first node, such that the first well is controlled by the switch and floated under an electrostatic discharge (ESD) protection mode. (B) The switch is coupled between the second well and the second node, such that the second well is controlled by the switch and floated under an electrostatic discharge (ESD) protection mode. Further, the operation method of the semiconductor structure comprises at least one of following steps (a) and (b) corresponding to the conditions (A) and (B), respectively. (a) Under the ESD protection mode, the switch r is turned off, and thereby the first well is floated. (b) Under the ESD protection mode, the switch is turned off, and thereby the second well is floated.

Now, with reference to accompany drawings, various details of exemplarily semiconductor structures according to embodiments will be described. It is contemplated that elements and features of one embodiment may be beneficially incorporated in another embodiment without further recitation.

FIG. 1 shows a semiconductor structure according to one embodiment. The semiconductor structure comprises a first well 102, a second well 104, a first heavily doped region 112, and a second heavily doped region 114. The first well 102 has a first conductive type, such as n-type. The second well 104 has a second conductive type, such as p-type. The second well 104 is coupled to the first well 102. The first heavily doped region 112 has the second conductive type, such as p-type. The first heavily doped region 112 is coupled to the first well 102. For example, the first heavily doped region 112 is disposed in the first well 102. The first heavily doped region 112 is coupled to a first node 122, such as an anode. The second heavily doped region 114 has the first conductive type, such as n-type. The second heavily doped region 114 is coupled to the second well 104. For example, the second heavily doped region 114 is disposed in the second well 104. The second heavily doped region 114 is coupled to a second node 124, such as a cathode. As such, the first well 102, the second well 104, the first heavily doped region 112 and the second heavily doped region 114 constitute a SCR.

At least one of the first well 102 and the second well 104 is coupled to at least one switch 130, such that the at least one of the first well 102 and the second well 104 is floated under the ESD protection mode. In this embodiment, both of the first well 102 and the second well 104 are coupled to the at least one switch 130. Exemplarily switches suitable for this condition will be illustrated with reference to FIGS. 2A and 2B.

Still referring to FIG. 1, the semiconductor structure may further comprise a third well 106. The third well 106 has the second conductive type, such as p-type. In this embodiment, the first well 102 is disposed in a substrate 100, such as a substrate 100 having the second conductive type, such as p-type. Further, the second well 104 is disposed in the first well 102. The third well 106 is also disposed in the first well 102, and separated from the second well 104. In this embodiment, the first heavily doped region 112 is disposed in the third well 106.

The semiconductor structure may further comprise a third heavily doped region 116. The third heavily doped region 116 has the first conductive type, such as n-type. The third heavily doped region 116 is coupled to the first well 102. For example, the third heavily doped region 116 is disposed in the first well 102. In this embodiment, the first well 102 is coupled to the switch 130 through the third heavily doped region 116. This switch 130 may further couple the first well 102 to the first node 122, such as the anode. By turning on or off this switch 130, the first well 102 can be controlled at a state connecting with the first node 122 or at a floating state.

The semiconductor structure may further comprise a fourth heavily doped region 118. The fourth heavily doped region 118 has the second conductive type, such as p-type. The fourth heavily doped region 118 is coupled to the second well 104. For example, the fourth heavily doped region 118 is disposed in the second well 104. In this embodiment, the second well 104 is coupled to the switch 130 through the fourth heavily doped region 118. This switch 130 may further couple the second well 104 to the second node 124, such as the cathode. By turning on or off this switch 130, the second well 104 can be controlled at a state connecting with the second node 124 or at a floating state.

Figure 2A:
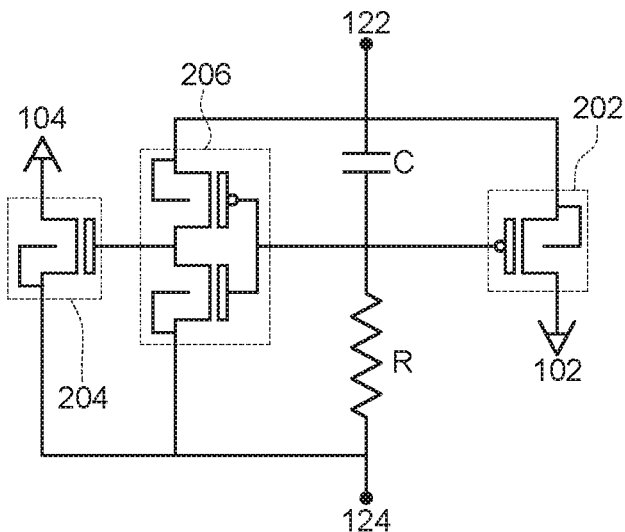
FIGS. 2A and 2B show exemplarily switches that can be used in the semiconductor structure shown in FIG. 1.
Figure 2B:
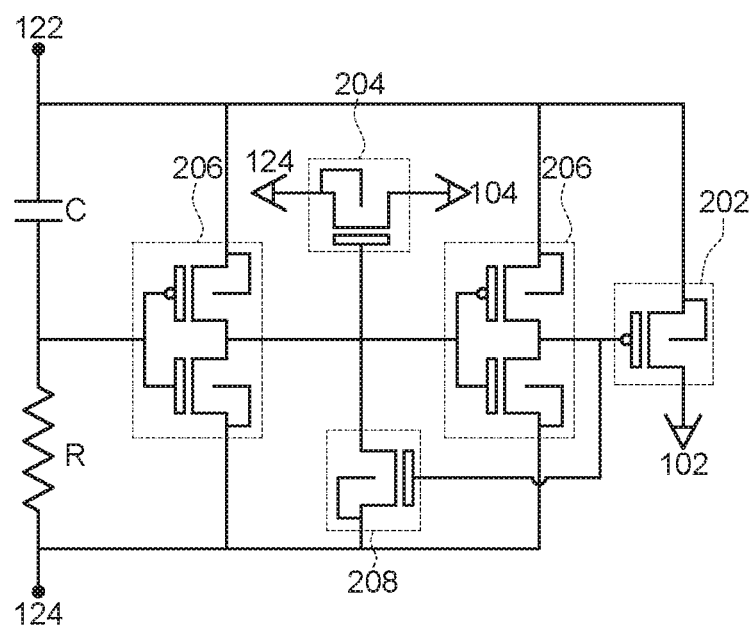

Now referring to FIGS. 2A and 2B, exemplarily switches that are particularly suitable for the semiconductor structure of FIG. 1 in are shown. The two exemplarily switches are particularly suitable for simultaneously controlling the first well 102 and the second well 104 since both the first well 102 and the second well 104 in the semiconductor structure of FIG. 1 are controlled by the at least one switch 130.

As shown in FIG. 2A, a switch may comprise a first transistor 202 and a second transistor 204. The first transistor 202 controls a current path from the first node 122 to the first well 102. The second transistor 204 controls a current path from the second node 124 to the second well 104. The second transistor 204 is complementary to the first transistor 202. In this exemplarily switch, the first transistor 202 is a PMOS, and the second transistor 204 is a NMOS. The switch may further comprise an inverter 206 disposed between the first transistor 202 and the second transistor 204. The switch may further comprise a capacitor C and a resistor R. In this exemplarily switch, a first terminal of the capacitor C is connected to the first node 122, a second terminal of the capacitor C is connected to a first terminal of the resistor R, and a second terminal of the resistor R is connected to the second node 124. The first transistor 202 is connected to the second terminal of the capacitor C. The second transistor 204 is connected to the second terminal of the capacitor C through the inverter 206.

Under the normal mode, a low-level signal is provided to and turns on the first transistor 202. As such, the first transistor 202 allows the current path from the first node 122 to the first well 102. Thereby, the first well 102 is coupled to the first node 122. At the same time, the low-level signal is converted to a high-level signal and provided to the second transistor 204. As such, the second transistor 204 is turned on and allows the current path from the second node 124 to the second well 104. Thereby, the second well 104 is coupled to the second node 124.

During an ESD event, the capacitor C will allow a current passing through. At this time, a high-level signal turns off the first transistor 202, and thereby the first well 102 is floated. The high-level signal is converted to a low-level signal and provided to the second transistor 204. As such, the second transistor 204 is also turned off, and thereby the second well 104 is floated.

Another exemplarily switch is shown in FIG. 2B, it comprises more inverters 206 and an additional transistor 208. However, similar to the exemplarily switch of FIG. 2A, under the ESD protection mode, the first transistor 202 and the second transistor 204 are turned off, such that the current path from the first node 122 to the first well 102 and the current path from the second node 124 to the second well 104 are cut, and thereby the first well 102 and the second well 104 is floated. While under the normal mode, both of the first transistor 202 and the second transistor 204 are turned on, so as to allow the current path from the first node 122 to the first well 102 and the current path from the second node 124 to the second well 104, and thereby the first well 102 is coupled to the first node 122 and the second well 104 is coupled to the second node 124. More specifically, normally, a low-level signal at the second terminal of the capacitor C is converted twice by the two inverters 206, and thereby a low-level signal is provided to and turns on the first transistor 202. The low-level signal at the second terminal of the capacitor C is converted only once by one inverter 206, and thereby a high-level signal is provided to and turns on the second transistor 204. Further, since the transistor 208 coupled between the second transistor 204 and the second node 124 is a NMOS here, it is turned off when normally operating. As such, the first well 102 is coupled to the first node 122, and the second well 104 is coupled to the second node 124. During an ESD event, a high-level signal is provided to and turns off the first transistor 202, a low-level signal is provided to and turns off the second transistor 204, and the low-level signal is provided to and turns on the transistor 208. As such, both the first well 102 and the second well 104 are at a floating state.

While the examples described above are directed to the switch 130 that controls the first well 102 and the second well 104 at the same time, the switch 130 that controls only one of the first well 102 and the second well 104 is also usable. As an example, the first transistor 202 is coupled between the first well 102 and the first node 122, but the second transistor 204 is not coupled between the second well 104 and the second node 124. As another example, the second transistor 204 is coupled between the second well 104 and the second node 124, but the first transistor 202 is not coupled between the first well 102 and the first node 122. Alternatively, a switch 130 of other suitable types may be usable. Such a switch 130 is particularly usable for the embodiments in which only one of the first well 102 and the second well 104 is controlled by the switch 130, like those shown in FIGS. 3 to 6. However, as to the embodiment shown in FIG. 1, the first well 102 may be coupled to a switch 130 through the third heavily doped region 116, and the second well 104 may be coupled to another switch 130 through the fourth heavily doped region 118. In the case that a switch 130 controls only one of the first well 102 and the second well 104, when under the ESD protection mode, at least one of the first transistor 202 that controls the current path from the first node 122 to the first well 102 and the second transistor 204 that controls the current path from the second node 124 to the second well 104 is turned off, such that at least one of the current path from the first node 122 to the first well 102 and the current path from the second node 124 to the second well 104 is cut, and thereby the at least one of the first well 102 and the second well 104 is floated.

By floating a well of a SCR, a displacement current is introduced, and thereby the SCR can be turned on in a more efficient manner without the avalanche breakdown. As such, the SCR with a floating well can have a lower trigger voltage. However, the floating well makes the SCR easily latched to the ground node. N/P protection rings have been introduced into the structures to solve the problem, but only have limited success.

According to the embodiments described herein, the floating state of the well(s) is controlled by a switch. As such, during an ESD event, the well(s) can be floated, and thereby a lower trigger voltage is provided to the ESD protection mode. While under a normal mode, the wells are coupled to the nodes correspondingly. Thereby, the latch-up of the SCR can be avoided.

Figure 3:
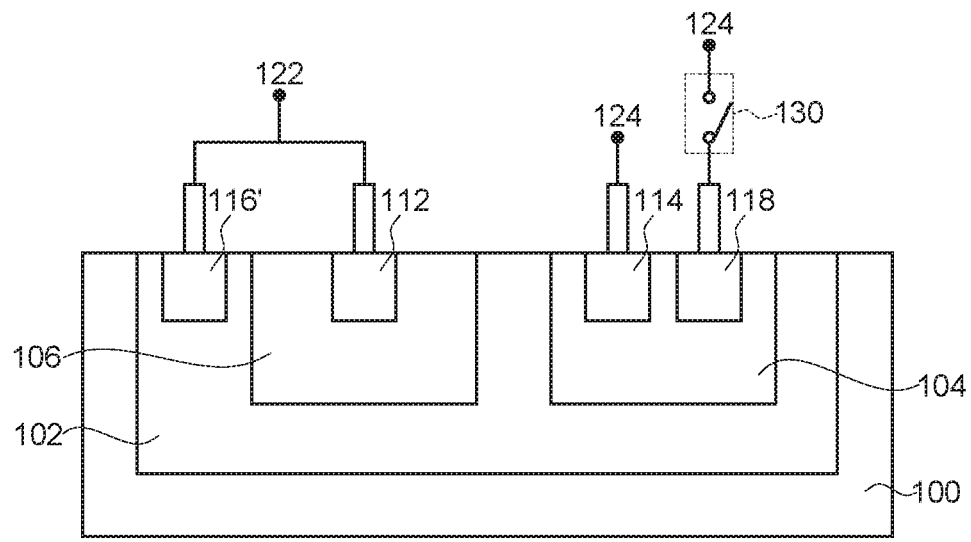
FIG. 3 shows a semiconductor structure according to one embodiment.

FIG. 3 shows a semiconductor structure according to another embodiment. In this embodiment, the first well 102 is directly coupled to the first node 122 through the third heavily doped region 116'. Here, the term "directly" is used to indicate that there is no switch coupled therebetween. In this embodiment, only the second well 104 is coupled to the switch 130, such as through the fourth heavily doped region 118.

Figure 4:
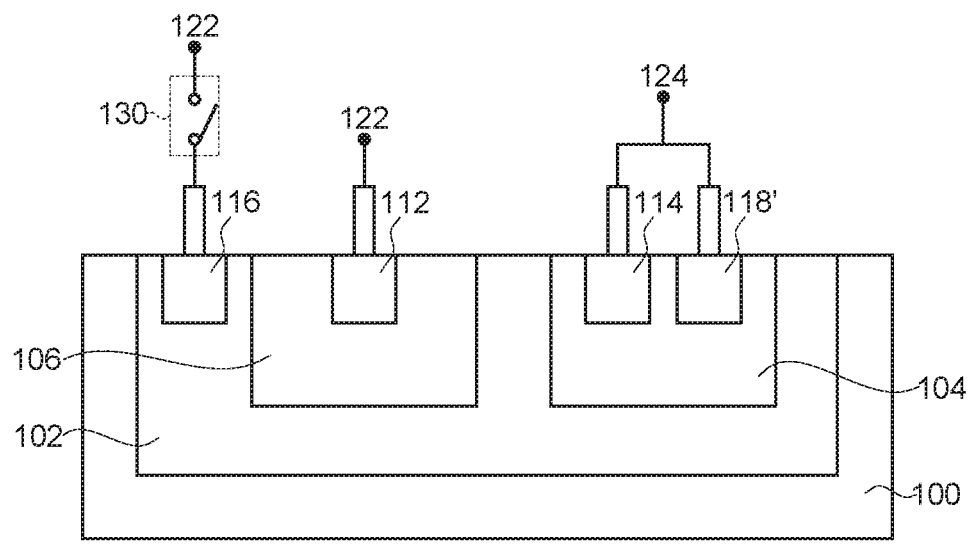
FIG. 4 shows a semiconductor structure according to one embodiment.

FIG. 4 shows a semiconductor structure according to another embodiment. In this embodiment, only the first well 102 is coupled to the switch 130, such as through the third heavily doped region 116. The second well 104 is directly coupled to the second node 124 through the fourth heavily doped region 118'.

Figure 5:
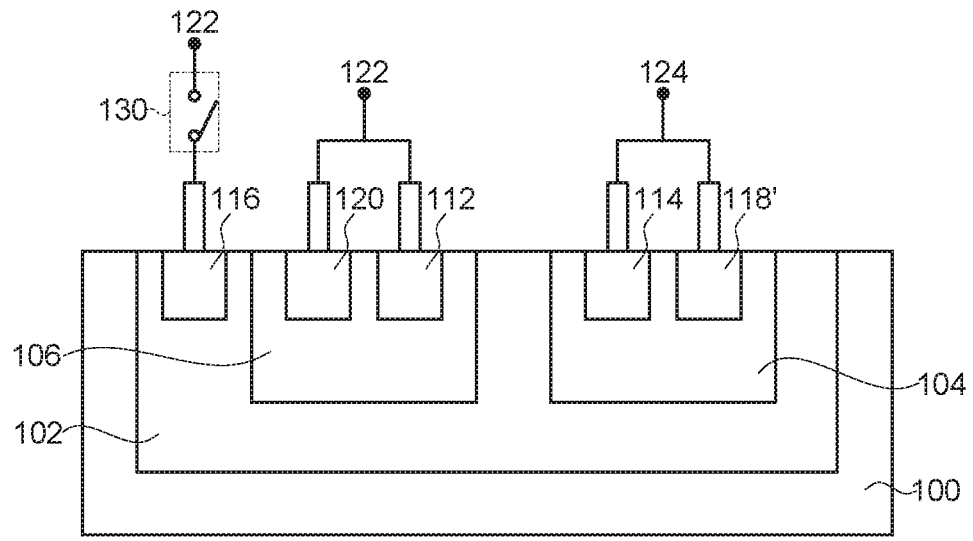
FIG. 5 shows a semiconductor structure according to one embodiment.

FIG. 5 shows a semiconductor structure according to another embodiment. Similar to the embodiment of FIG. 4, only the first well 102 is coupled to the switch 130, such as through the third heavily doped region 116, and the second well 104 is directly coupled to the second node 124 through the fourth heavily doped region 118'. However, in this embodiment, the semiconductor structure further comprises a fifth heavily doped region 120. The fifth heavily doped region 120 has the first conductive type, such as n-type. The fifth heavily doped region 120 is coupled to the third well 106. For example, the fifth heavily doped region 120 is disposed in the third well 106. The fifth heavily doped region 120 is coupled to the first node 122. This semiconductor structure is more symmetrical than the semiconductor structure shown in FIG. 4.

Figure 6:
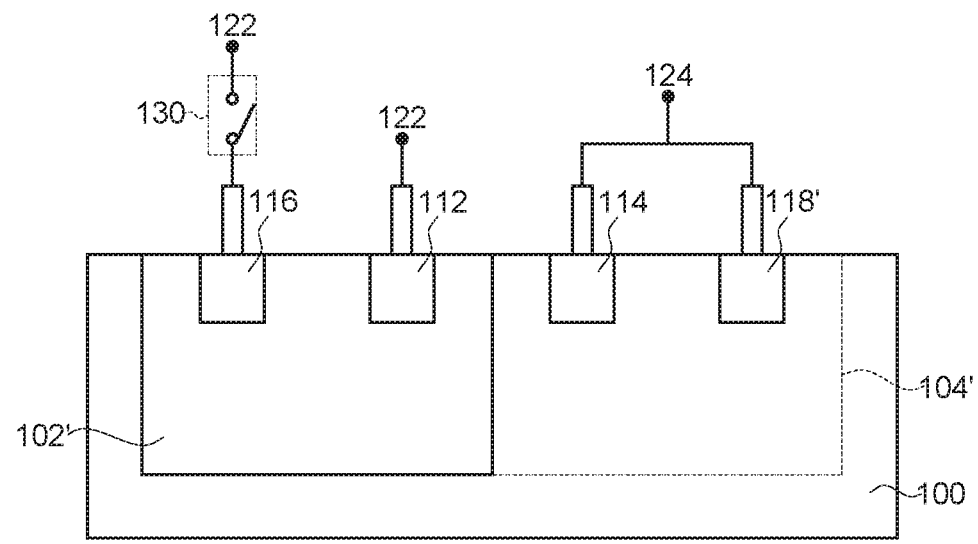
FIG. 6 shows a semiconductor structure according to one embodiment.

FIG. 6 shows a semiconductor structure according to still another embodiment. In this embodiment, the second well 104' is disposed directly in and even part of the substrate 100. The second well 104' is adjacent to the first well 102'. In this embodiment, only the first well 102' is coupled to the switch 130, such as through the third heavily doped region 116. The second well 104' is directly coupled to the second node 124 through the fourth heavily doped region 118'.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
a first well having a first conductive type;
a second well having a second conductive type different from the first conductive type, the second well coupled to the first well;
a first heavily doped region having the second conductive type, the first heavily doped region coupled to the first well, the first heavily doped region coupled to a first node;
a second heavily doped region having the first conductive type, the second heavily doped region coupled to the second well, the second heavily doped region coupled to a second node;
a third heavily doped region having the first conductive type, the third heavily doped region coupled to the first well; and
at least one switch configured to satisfy at least one of following conditions (A) and (B):
(A) the switch coupled between the first well and the first node, such that the first well is controlled by the switch and floated under an electrostatic discharge (ESD) protection mode; and
(B) the switch coupled between the second well and the second node, such that the second well is controlled by the switch and floated under an electrostatic discharge (ESD) protection mode.

2. The semiconductor structure according to claim 1, wherein, under a normal mode, the first well is coupled to the first node, and the second well is coupled to the second node.

3. The semiconductor structure according to claim 2, wherein the first node is an anode, and the second node is a cathode.

4. The semiconductor structure according to claim 1, wherein the first well is coupled to the at least one switch through the third heavily doped region.

5. The semiconductor structure according to claim 1, wherein the first well is directly coupled to the first node through the third heavily doped region.

6. The semiconductor structure according to claim 1, further comprising:
a fourth heavily doped region having the second conductive type, the fourth heavily doped region coupled to the second well.

7. The semiconductor structure according to claim 6, wherein the second well is coupled to the at least one switch through the fourth heavily doped region.

8. The semiconductor structure according to claim 6, wherein the second well is directly coupled to the second node through the fourth heavily doped region.

9. The semiconductor structure according to claim 6, wherein the first well is coupled to the at least one switch through the third heavily doped region, and the second well is coupled to the at least one switch through the fourth heavily doped region.

10. The semiconductor structure according to claim 6, further comprising:
a third well having the second conductive type, wherein the second well is disposed in the first well, the third well is disposed in the first well and separated from the second well, and the first heavily doped region is disposed in the third well.

11. The semiconductor structure according to claim 10, further comprising:
a fifth heavily doped region having the first conductive type, the fifth heavily doped region coupled to the third well, the fifth heavily doped region coupled to the first node.

12. The semiconductor structure according to claim 1, wherein the second well is adjacent to the first well.

13. The semiconductor structure according to claim 1, wherein the first conductive type is n-type, and the second conductive type is p-type.

14. The semiconductor structure according to claim 1, wherein the switch comprises:
a first transistor controlling a current path from the first node to the first well; and
a second transistor controlling a current path from the second node to the second well.

15. The semiconductor structure according to claim 14, wherein the switch further comprises: a capacitor, a resistor, and at least one inverter.

16. An operation method of a semiconductor structure according to claim 1, comprising at least one of following steps (a) and (b) corresponding to the conditions (A) and (B), respectively:
(a) under the ESD protection mode, turning off the switch, so as to float the first well; and
(b) under the ESD protection mode, turning off the switch, so as to float the second well.

17. The operation method according to claim 16, further comprising:
under a normal mode, coupling the first well to the first node and coupling the second well to the second node.

18. The operation method according to claim 16, wherein the switch comprises:
a first transistor controlling a current path from the first node to the first well; and
a second transistor controlling a current path from the second node to the second well.

19. The operation method according to claim 18, wherein the switch further comprises: a capacitor, a resistor, and at least one inverter.

* * * * *